United States Patent
Ma et al.

(10) Patent No.: US 6,292,054 B1
(45) Date of Patent: *Sep. 18, 2001

(54) SYSTEM AND METHOD FOR PRODUCING AN AMPLIFIED SIGNAL

(75) Inventors: Zhengxiang Ma, Summit; Paul Anthony Polakos, Marlboro, both of NJ (US)

(73) Assignee: Lucent Technologies Inc., Murray Hill, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/444,319

(22) Filed: Nov. 19, 1999

(51) Int. Cl.$^7$ .................................................. H03F 3/68
(52) U.S. Cl. .................. 330/126; 330/124 R; 455/126; 375/296; 333/17.2
(58) Field of Search ........................ 330/124 R, 126, 330/295; 455/126, 103, 127; 375/296; 333/20, 17.2

(56) References Cited

U.S. PATENT DOCUMENTS

| | | | |
|---|---|---|---|
| 4,283,685 | * 8/1981 | MacMaster et al. | 330/286 |
| 5,101,171 | * 3/1992 | Redmond | 330/124 R |
| 5,262,958 | * 11/1993 | Chui et al. | 364/487 |
| 5,822,370 | * 10/1998 | Graupe | 375/240 |
| 5,969,572 | * 10/1999 | Jeong et al. | 330/149 |
| 6,054,894 | * 4/2000 | Wright et al. | 330/149 |

OTHER PUBLICATIONS

"The Doherty Amplifier", *RF Power Amplifiers for Wireless Communications*, by S. C. Cripps, publ. Artech House, pp. 225–239 (1999).

* cited by examiner

*Primary Examiner*—Robert Pascal
*Assistant Examiner*—Henry Choe

(57) ABSTRACT

A signal amplification system involves decomposing a signal into two or more parts, amplifying the parts and then combining the amplified parts to produce the amplified signal. The decomposition can be done such that the resulting parts have characteristics that are amenable to efficient amplification. For example, decomposition of the signal to be amplified can be done using at least one threshold. The first part of the signal to be amplified can be formed by the portion of the signal within the threshold. As such, because the first part forms a signal with a lower PAR, the first part of the signal can be amplified more efficiently than the original signal. The second part of the signal can be formed by the portion of the original signal beyond the threshold. Because the second part is mostly zero, the second part can also be amplified efficiently, for example with a class C type amplifier which does not dissipate any energy when the input signal is zero.

13 Claims, 3 Drawing Sheets

SYSTEM AND METHOD FOR PRODUCING AN AMPLIFIED SIGNAL

BACKGROUND OF THE INVENTION

1. Field of The Invention

This invention relates to amplifying a signal and, more particularly, to a system and method which enables efficient and/or linear amplification of a signal.

2. Description of Related Art

An ideal power amplifier amplifies an input signal with no waveshape alteration. The ideal power amplifier is therefore characterized as having a transfer function (input signal vs. output signal) which is linear with no transfer function discontinuities. In practice, a power amplifier, however, has a transfer function with nonlinear and "linear" regions. Whether the power amplifier is operating in a linear or nonlinear region depends on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses peak amplitudes which cause the amplifier to saturate (no appreciable increase in output amplitude with an increase in input amplitude) or to shut-off (no appreciable decrease in output amplitude with a decrease in input amplitude), the amplifer is being overdriven, and the output signal is clipped or severely distorted in a nonlinear fashion. Generally, an amplifier is characterized as having a clipping threshold, and input signals having amplitudes beyond the clipping threshold are clipped at the amplifier output. In addition to distorting the signal, the clipping or nonlinear distortion of the input signal, generates spectral regrowth or adjacent channel power (ACP) that can interfere with an adjacent frequency.

In wireless communications systems, high power amplification of signals for transmission are commonly encountered with very large peak to average power ratios (PAR). For example, in a time division multiple access (TDMA) system, when multiple carrier signals are combined for amplification with a power amplifier, the resulting PAR is about 9–10 dB for a large number of carriers. In a code division multiple access (CDMA) system, a single loaded 1.25 Mhz wide carrier can have a PAR of 11.3 dB. These signals have to be amplified fairly linearly to avoid generating ACP.

Unfortunately, efficiency of the base station amplifier is inversely related to its linearity. To achieve a high degree of linearity, the amplifiers are biased to operate in the class A or "slight" class AB (meaning class AB operation that is closer to class A than to class B). Maximum AC to DC efficiency achievable for class A operation is 50%, whereas that of a class AB amplifier is between 50 and 78.5% (the latter representing the maximum efficiency of a class B amplifier). The closer the particular class AB operation is to class A, the lower the maximum efficiency. For amplifiers employing field effect transistors, the class of operation is set in accordance with the gate voltage applied, which controls the quiescent (idle) drain current. For class A operation, the gate voltage is set so that the idle drain current is approximately in the middle of the range between cutoff and saturation. Class B amplifiers are biased near or at cutoff, resulting in a rectified drain current waveform. Class AB amplifiers are biased in between the bias points of classes A and B. Class C amplifiers are biased below cutoff. As such, class C amplifiers do not dissipate energy when the amplitude of the input signal is below a certain level.

Typically, strict linearity requirements in modem wireless communication systems dictate the use of the relatively inefficient class A or slight class AB modes. As a result, significant DC power is dissipated by the amplifiers, thereby generating heat which must be controlled to avoid degrading amplifier performance and reliability. Hence, the use of elaborate heat sinks and fans become a necessary by-product of the high linearity system. Naturally, these measures add to the cost, size and weight of the base station equipment. As the number of wireless communications users continues to grow, so do the number of base stations and the need to keep them small, light and inexpensive. Thus, a great deal of research has focused on the quest to improve amplifier efficiency in these and other systems.

Various linearization methods are used to enable the use of more cost-effective and more power efficient amplifiers while maintaining an acceptable level of linearity. Feed-forward correction is routinely deployed in modem amplifiers to improve the linearity of the main amplifier with various input patterns. The essence of the feed-forward correction is to isolate the distortion generated by the main amplifier on a feed forward path. The distortion is provided to a correction amplifier on the feed forward path which amplifies the distortion. The distortion on the feed forward path is combined with the distortion on the main signal path to cancel the distortion on the main signal path. Another linearization technique use pre-distortion. Pre-distortion techniques distort the input signal prior to amplification by taking into account the transfer function characteristics for the amplifier. As such, the desired amplified signal is achieved from the pre-distorted input signal. These techniques help to improve the efficiency of the amplifier while maintaining linearity, but to be able to handle the large peaks of a signal, the amplifiers still operate inefficiently. Other linearization techniques are possible. For example, baseband processing techniques, such as peak clipping, reduce the peak to average power ratio (PAR) of the signal but tend to degrade the signal. The amount of PAR reduction is limited by the amount of tolerable degradation. Another technique uses the input signal envelope to dynamically adjust the amplifier bias such that a high bias is only applied when a large peak is encountered. Due to practical difficulties, actual realization of this technique have not been seen.

Due to the potential for high peak powers, CDMA, TDMA and frequency division multiple access (FDMA) base stations typically use radio frequency (RF) amplifiers operating in class AB mode and biased with a high current to be able to handle those peak powers. The efficiency of these amplifiers is typically less than 10%. This low efficiency leads to higher power consumption, lower overall reliability and higher operating temperatures. Accordingly, there is a need for a more efficient power amplifier architecture which can amplify signals having potentially high peak powers in a linear fashion.

SUMMARY OF THE INVENTION

The present invention is a signal amplification system which involves decomposing a signal into two or more parts, amplifying the parts and then combining the amplified parts to produce the amplified signal. The decomposition can be done such that the resulting parts have characteristics that are amenable to efficient amplification. For example, decomposition of the signal to be amplified can be done using at least one threshold. The first part of the signal to be amplified can be formed by the portion of the signal within the threshold. As such, because the first part forms a signal with a lower PAR, the first part of the signal can be amplified more efficiently than the original signal. The second part of the signal can be formed by the portion of the original signal beyond the threshold. Because the second part is mostly zero, the second part can also be amplified efficiently, for example with a class C type amplifier which does not dissipate any energy when the input signal is zero.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
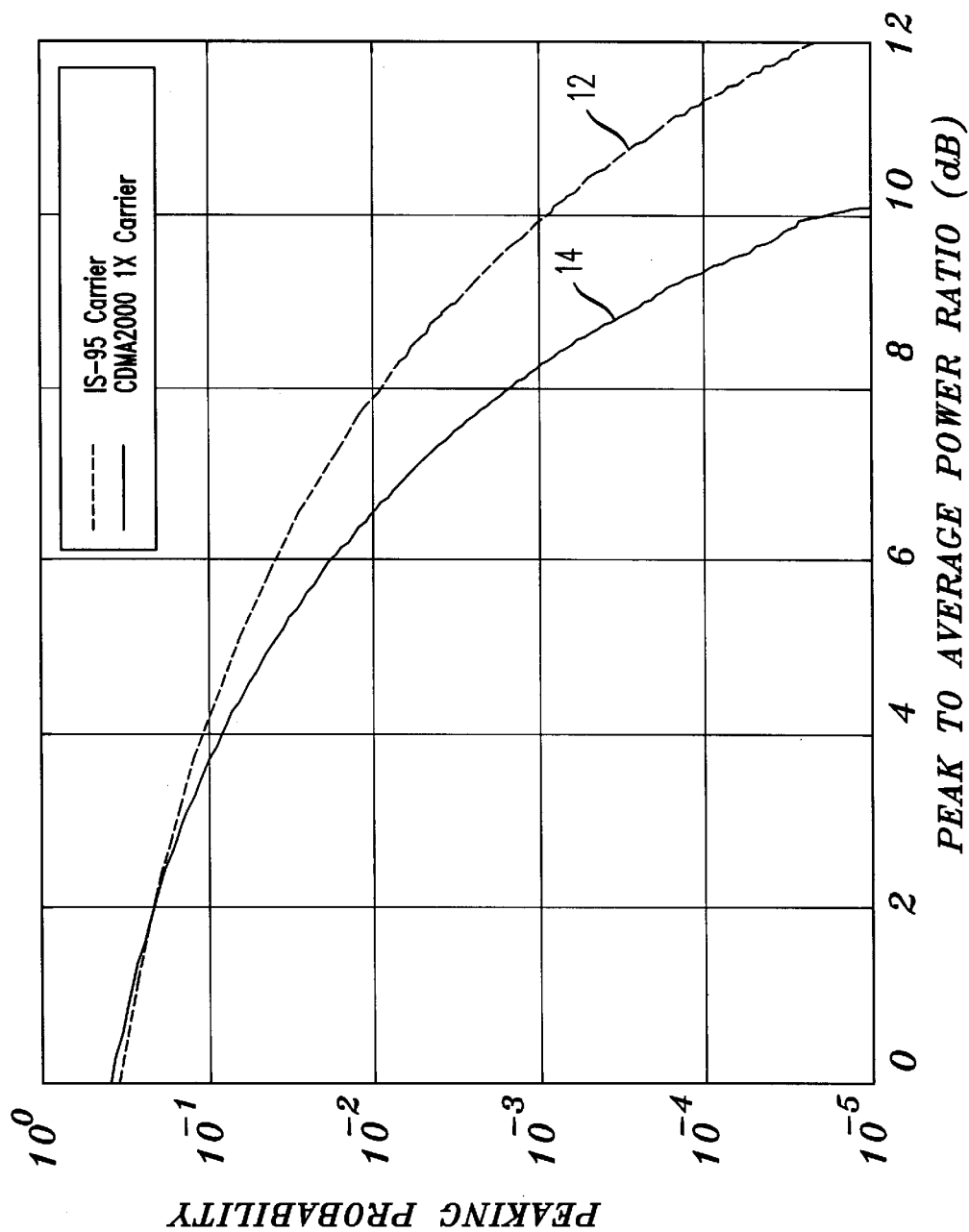
FIG. 1 shows the PAR of two CDMA carriers with 40 full rate users and a pilot signal power set at 15% of total power.

Illustrative embodiments of a power amplifier scheme according to the principles of the present invention are described below to improve the efficiency of power amplification of signals with large PAR. FIG. 1 shows a plot 12 of the PAR of an IS-95 code division multiple access (CDMA) 1.25 megahertz (MHz) carrier and a plot 14 of the PAR of a CDMA2000 1X carrier. A description of IS-95 can be found in the standard identified as EIA/TIA/IS-95 (Electronic Industries Association/Telecommunications Industry Association/Interim Standard 95) entitled "Mobile Station-Base Station Compatibility Standard for Dual-Mode Wideband Spread Spectrum Cellular System, March 1993 ("IS-95"). A description of CDMA 2000 can be found in the standard as TIA/EIA/IS-2000 entitled "Spread Spectrum Digital Technology—Mobile and Personal Communications Standards." The IS-95 carrier and the CDMA2000 carrier are both fully loaded with 40 full rate users and a pilot power of 15% of the total power. As shown in FIG. 1, at a peaking probability of $10^{-4}$ (indicating a 1/10,000 chance that a peak exceeds a certain level above average power), the loaded single carrier IS-95 carrier has a PAR of about 11.3 dB, and the loaded single carrier CDMA2000 signal has a PAR of about 9.6 dB.

The signal can be decomposed into parts using a separation threshold based on power level, for example 6 dB beyond the average power. With a separation threshold of 6 dB beyond the average power, FIG. 1 shows that 98% of the CDMA 2000 signal is within the separation threshold and forms a signal part with lower PAR (approximately 6 dB) while about 2% of the signal is beyond the threshold and forms a signal that is zero 98% of the time. FIG. 1 also shows that about 95% of the IS-95 signal is within the separation threshold of 6 dB and forms a signal part with lower PAR while about 5% of the signal is beyond the separation threshold.

Figure 2:
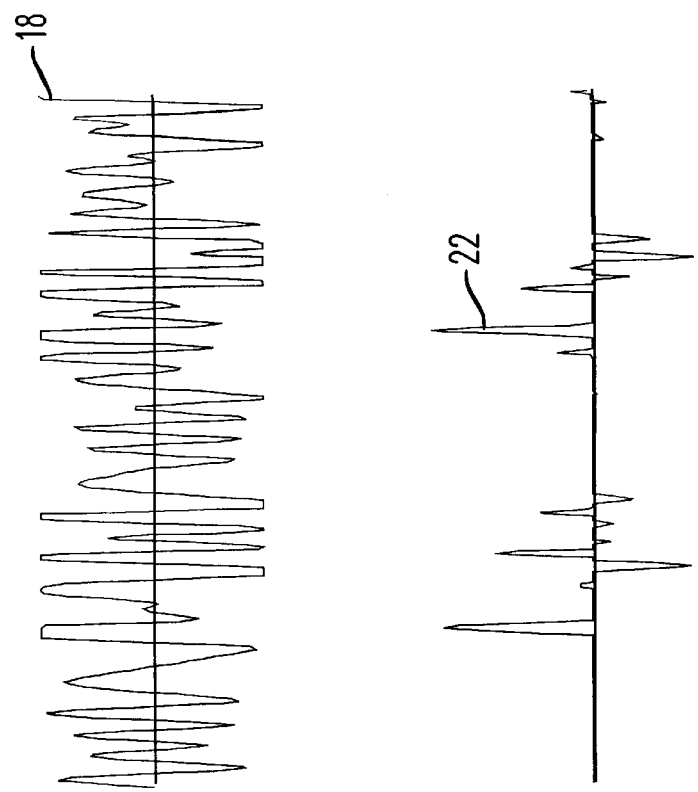
FIG. 2 shows the decomposition of a signal into parts within and beyond a threshold according to principles of the present invention.
Figure 2:
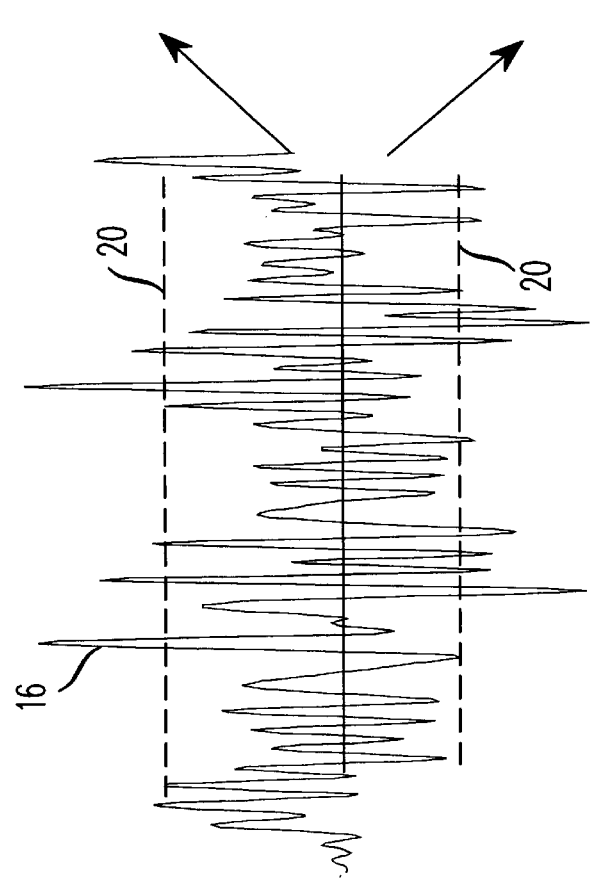

The decomposition of the signal 16 is graphically illustrated in FIG. 2. In this figure, the signal 16 is shown in time as having a signal level, for example a voltage level, and the separation threshold 20 is based on a positive and negative signal level. The separation threshold can be based on an amplitude or power level as suggested in the description of FIG. 1. For example, the power level of a signal having both in-phase (I) and quadrature (Q) components is $V_I^2+V_Q^2$, and the separation threshold can be based on a power level. As such, one part of the signal is above the separation threshold, and another part is below the separation threshold. The signal 16 is decomposed into a first part 18 which is within a threshold 20. The first part 16 has a lower PAR and can be amplified more efficiently than the original signal. The signal 16 is also decomposed into a second part 22 which is beyond the threshold 20. The second part 22 is mostly zero and can be amplified efficiently with a class C type amplifier, since a class C amplifier does not dissipate any energy when the input signal is zero. Depending on the embodiment, the signal 16 can be decomposed into more than two parts and/or can use multiple thresholds to decompose the original signal 16. Other ways of decomposing the original signal 16 are possible. For example, the decomposition of the signal can occur at baseband, at an intermediate frequency (IF) or at radio frequency (RF) using discrete components to perform the described function as would be understood by one of skill in the art. Other decompositions of the original signal are possible, for example the at least first and second parts can be a set or changing proportions or functions of the amplitude of the original signal.

Figure 3:
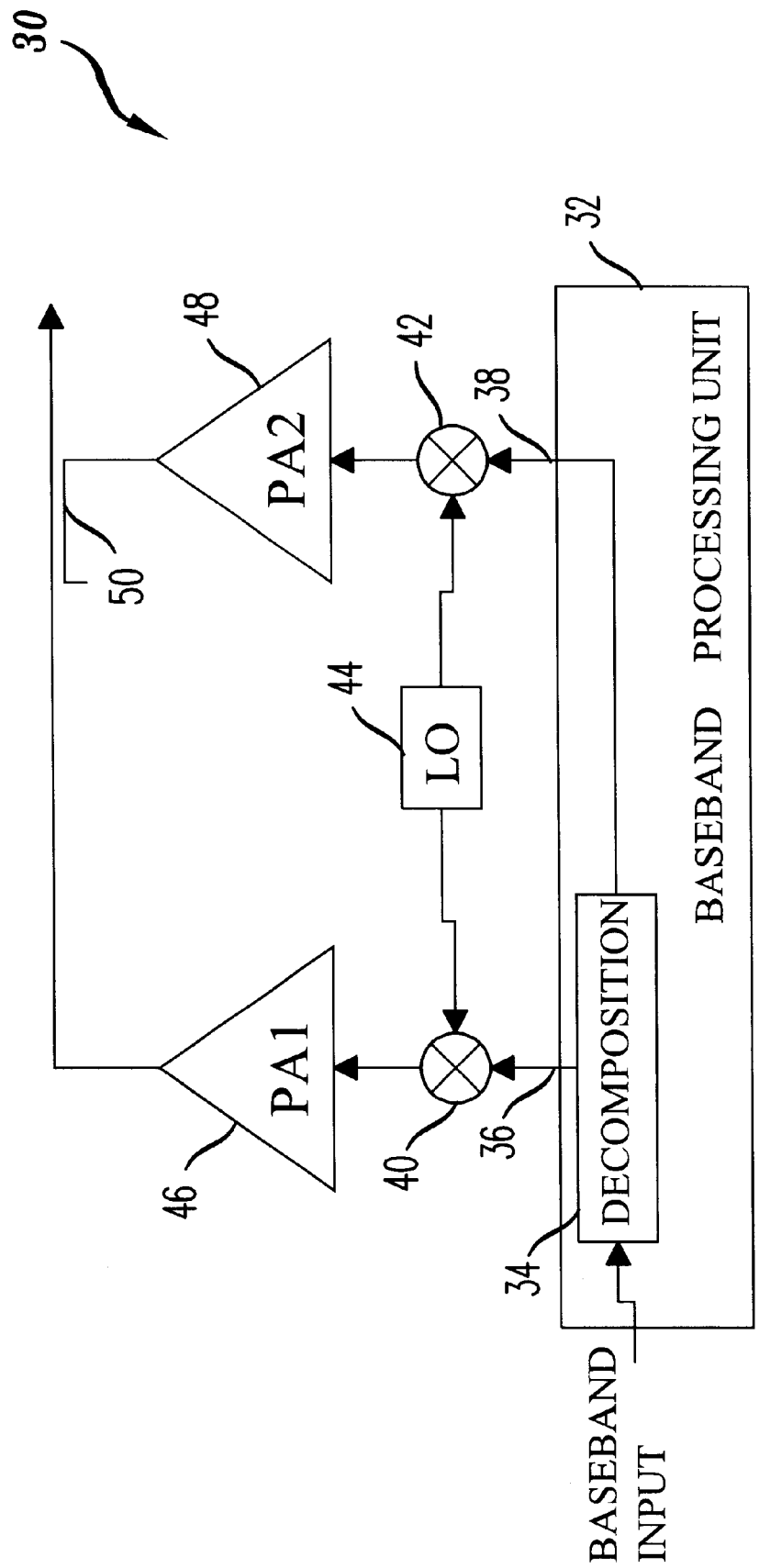
FIG. 3 shows an example amplifier architecture using a baseband digital implementation to decompose the signal according to principles of the present invention.

FIG. 3 shows a conceptual block diagram for an amplifier architecture 30 in which the decomposition is implemented digitally at baseband. In this embodiment, a processing unit or circuitry 32 receives a digital signal at baseband and performs a decomposition 34 on the baseband input signal. The decomposition block 34 decomposes the signal and produces a first part on a first amplifier path 36 and a second part on a second amplifier path 38. In this embodiment, the first and second parts or portions are distinct, for example having distinct time domain characteristics and/or distinct frequency domain characteristics. The first part can be the portion of the original signal within a threshold, and the second part can be the portion of the signal beyond a threshold. In this embodiment, a second power amplifier (PA2) 48 receives the RF signal from the mixer 42 and amplifies the signal on the second amplifier path 38 which represents the intermittent peaks of the original signal beyond the threshold. The output of the amplifiers 46 (PA1) and 48 (PA2) are combined at a combiner or coupler 50 to form the final amplified output signal. The combiner or coupler 50 can be part of a matched impedance network, for example of 50 ohms, to maintain the output impedance level viewed by the amplifiers 46 and 48. The amplifier(s) 46 (PA1) and/or 48 (PA2) can be part of a feed forward or pre-distortion architecture or individually represent an amplifier linearized by either feed forward or pre-distortion. For example, the first and/or second parts of the signal can be pre-distorted for amplification by the 46 and/or 48. Also, the amplified signal could be linearized using feed forward. Depending on the embodiment, the original signal can be decomposed into additional parts which are placed on additional paths, amplified by additional power amplifiers, and combined to form the amplified linear output signal.

In a typical feed-forward linearizer circuit implemented in the analog domain, the correction amplifier has to be a very linear amplifier. If there is significant saturation in the main amplifier, which will increase the efficiency of the main amplifier, the error signal also has very high dynamic range. Therefore, the correction amplifier is operating at low efficiency. In the present invention, the second amplifier is operating at high efficiency. Additionally, there is no need for the analog RF delay line required in a feed forward circuit to ensure that the amplified signal with distortion is combined at the right time with the isolated distortion on the feed forward path to remove the distortion.

As an example, if an amplifier is needed for a signal with 10 watts average output power and the PAR of the signal is 9 dB after some baseband peak limiting algorithm, the amplifier has to be able to handle peak power of 80 watts (9 dB translates into a factor of about 8). Using the architecture 30, suppose the combiner 50 is a 6 dB directional coupler and the separation threshold is at 5 dB above the average, the main amplifier 46 needs only to be able to handle peak power of about 42.5 watts which is 6.25 dB above 10 watts, taking into account the 1.25 dB loss through the combiner (5 dB+1.25 dB=6.25 dB). The PAR of the signal which the main amplifier 46 is amplifying can be calculated to be about 6.4 dB, a drop of about 2.6 dB. The efficiency of the main amplifier 46 will be much higher than the single amplifier. After the 1.25 dB loss in the combiner 50, the first amplified part can have a peak power of about 32 watts. Since we want 80 watts of power, the auxiliary amplifier 48 has to handle peak power of about 43.6 watts taking into account the 6 dB loss through the combiner 50, where the peak power of 43.6 watts=$(\sqrt{80}-\sqrt{32})^2 *6$ dB (which is about a factor of 4). However, in this embodiment, the second amplifier 48 is turned on less than 5% of the time. During the on-time, the PAR of the signal it is amplifying can be calculated to be about 4.9 dB. As such, the auxiliary amplifier can operate very efficiently.

In comparison, given an approach where a signal is split into two replicas of the original signal and each is amplified by two amplifiers each capable of handling 80 watts peak power, simply power combining the two amplifiers will yield a power amplifier capable of delivering 20 Watts average power for a signal with 9 dB PAR. Each amplifier is on all the time and running at average power of 10 Watts. Using the new architecture with 6 dB coupler and 5 dB separation threshold, the architecture 30 is capable of delivering 18.3 Watts average power, slightly lower than the 20 watts of the previous scheme. Although the main amplifier 46 runs at 17.9 watts average power, the main amplifier 46 dissipates only slightly more than one of the devices in the previous scheme because the quiescent bias dissipation (power dissipated at zero input power) dominates the power consumption for such amplifiers. However, the second amplifier 48 acting as the auxiliary amplifier dissipates very little power because it is on only less than 5% of the time. When it is on, it is dissipating no more power than the other amplifier. Therefore the efficiency of the architecture 30 should be at least about 50% higher.

In addition to the embodiment described above, alternative configurations of the power amplifier system according to the principles of the present invention are possible which omit and/or add components and/or use variations or portions of the described system. For example, phase shifter(s) can be located on the signal paths prior to amplifier(s) 46 and/or 48 to adjust the relative phase between the parts to adjust for mismatches between the amplifiers 46 and 48 and to improve the combining of the signals. Moreover, coupler (s) could provide a sample(s) of the amplified signal to control circuitry or the processing circuitry 32 to provide control signals to the phase shifter(s) or to adjust the signals to improve performance. Additionally, the embodiment of the power amplifier system has been described as being used with a particular architecture where the original signal is decomposed in the digital baseband domain, but the decomposition can take place at IF or RF in the analog domain or in other amplifier or electrical circuit arrangements. For example, the decomposition of the input signal can be performed at IF or RF in decomposition circuitry after the conversion of the signal from digital baseband and/or IF.

The power amplifier system has been described as decomposing the signal using a separation threshold, but the decomposition can be accomplished using multiple and/or changing thresholds as well as other ways of separating a signal into different parts. The system has been described as using a coupler for combining the parts, but other combining devices, such as summers or combiners can be used. Depending on the application, the decomposition and/or power amplification circuitry can be positioned in or in addition to a feed forward, pre-distortion or other linearization or efficiency-improving techniques. The power amplification system has been further described as using different configurations of discrete components, but it should be understood that the feed forward system and portions thereof can be implemented in application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of producing an amplified signal, said method comprising:

decomposing a signal to be amplified into at least a first part and a second part using at least one amplitude threshold, wherein the first part includes a signal with a lower peak-to-average power ratio than the second part based on the amplitude threshold and the second part includes a signal with a higher peak-to-average power ratio than the first part based on the amplitude threshold;

amplifying said at least said first part and said second part to produce at least an amplified first part and an amplified second part; and combining said at least said amplified first part and said amplified second part to produce an amplified signal.

2. The method of claim 1 wherein said decomposing further including:

providing said first part of said signal as being the portion of said signal within a threshold; and providing said second part of said signal as being the portion of said signal beyond a threshold.

3. The method of claim 2 wherein said decomposing including:

detecting an amplitude for said signal; and comparing said amplitude for said signal with said threshold.

4. The method of claim 2 wherein said amplifying including:

amplifying said first part with a first amplifier; and amplifying said second part with a second amplifier.

5. The method of claim 2 further including:

upconverting said first part prior to amplification; and upconverting said second part prior to amplification.

6. The method of claim 2 wherein said providing said first part including:

providing said first part having a reduced peak to average power ratio compared to said signal.

7. The method of claim 1 wherein said combining includes:

using a matched impedance network to combine said first part and said second part.

8. The method of claim 7 wherein said using includes:

using a directional coupler to combine said first part and said second part.

9. The method of claim 3 wherein said decomposing includes:

performing said decomposing of said signal in a baseband digital domain.

10. A signal amplification system comprising:

circuitry configured to decompose a signal to be amplified and at least produce a first part on a first path and a second part on a second path based on at least one amplitude threshold, wherein the first part includes a signal with a lower peak-to-average power ratio than the second part based on the amplitude threshold and the second part includes a signal with a higher peak-to-average power ratio than the first part based on the amplitude threshold;

a first amplifier on said first path receives said first part and amplifies said first part to produce an amplified first part;

a second amplifier on said second path receives said second part and amplifies said second part to produce an amplified second part; and combining circuitry configured to receive said amplified first part and said amplified second part and to combine said amplified first part and said amplified second part to produce an amplified signal.

11. The system of claim 10 wherein said circuitry configured to compare an amplitude for said signal with a threshold and produce the portion of said signal within a threshold as said first part and produce the portion of said signal beyond a threshold as said second part.

12. The system of claim 10 wherein said circuitry is configured as at least part of a matched impedance network to combine said first part and said second part.

13. The system of claim 10 wherein said circuitry includes a directional coupler.

* * * * *